US012593714B2

(12) United States Patent
Kim et al.

(10) Patent No.: US 12,593,714 B2
(45) Date of Patent: Mar. 31, 2026

(54) SEMICONDUCTOR DEVICE INCLUDING BONDING ENHANCEMENT LAYER AND METHOD OF FORMING THE SAME

(71) Applicant: SAMSUNG ELECTRONICS CO., LTD., Suwon-si (KR)

(72) Inventors: Taeyeong Kim, Yongin-si (KR); Taeseong Kim, Suwon-si (KR); Kwangjin Moon, Hwaseong-si (KR); Hyungjun Jeon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 603 days.

(21) Appl. No.: 17/544,081

(22) Filed: Dec. 7, 2021

(65) Prior Publication Data

US 2022/0406740 A1 Dec. 22, 2022

(30) Foreign Application Priority Data

Jun. 22, 2021 (KR) ........................ 10-2021-0080489

(51) Int. Cl.
H01L 23/00 (2006.01)
H01L 23/488 (2006.01)
(Continued)

(52) U.S. Cl.
CPC ............ *H01L 24/04* (2013.01); *H01L 23/488* (2013.01); *H01L 24/83* (2013.01); *H10F 39/8053* (2025.01); *H10F 39/8063* (2025.01)

(58) Field of Classification Search
CPC ..... H01L 24/80; H01L 25/043; H01L 25/065; H01L 25/0657; H01L 25/0756; H01L 25/117; H01L 2224/0812; H01L 2224/08123; H01L 2224/08145; H01L 2224/808; H01L 24/04; H01L 24/83; H10F 39/8053; H10F 39/8063; H10F 39/026; H10F 39/8057; H10F 39/809
See application file for complete search history.

(56) References Cited

U.S. PATENT DOCUMENTS 6,218,732 B1 4/2001 Russell et al.
7,826,694 B2 11/2010 Vandentop et al.
(Continued)

*Primary Examiner* — Julio J Maldonado
*Assistant Examiner* — Stanetta D Isaac
(74) *Attorney, Agent, or Firm* — Fish & Richardson P.C.

(57) ABSTRACT

A semiconductor device including a first structure including a first dielectric layer and a first conductive pattern in the first dielectric layer, the first conductive pattern including a first conductive material and a first bonding enhancement material; a second structure including a second dielectric layer and a second conductive pattern in the second dielectric layer, the second dielectric layer directly contacting the first dielectric layer, the second conductive pattern directly contacting the first conductive pattern; and a first bonding enhancement layer between the first conductive pattern and the second dielectric layer, wherein the first bonding enhancement layer includes the first bonding enhancement material or a material of the second dielectric layer, and the first bonding enhancement material includes a material having a higher bonding force to the material of the second dielectric layer than a bonding force of the first conductive material to the material of the second dielectric layer.

19 Claims, 7 Drawing Sheets

(51) Int. Cl.
　　*H01L 27/146*　　　(2006.01)
　　*H10F 39/00*　　　(2025.01)

(56)　　　　　　References Cited

U.S. PATENT DOCUMENTS

| | | | |
|---|---|---|---|
| 9,142,517 | B2 | 9/2015 | Liu et al. |
| 10,224,283 | B2 | 3/2019 | Canaperi et al. |
| 2013/0113106 | A1 | 5/2013 | Nguyen |
| 2013/0207271 | A1 | 8/2013 | Hagimoto et al. |
| 2014/0117546 | A1 | 5/2014 | Liu et al. |
| 2014/0239499 | A1 | 8/2014 | Okuyama |
| 2017/0354199 | A1 | 12/2017 | Hagimoto et al. |
| 2017/0358553 | A1* | 12/2017 | Kim ........................ H01L 24/92 |
| 2020/0148593 | A1* | 5/2020 | Kim ...................... C23C 16/045 |
| 2021/0265293 | A1* | 8/2021 | Tagami ................... H01L 24/80 |
| 2022/0223635 | A1* | 7/2022 | Kao ...................... H10F 39/807 |

* cited by examiner

SEMICONDUCTOR DEVICE INCLUDING BONDING ENHANCEMENT LAYER AND METHOD OF FORMING THE SAME

CROSS-REFERENCE TO THE RELATED APPLICATION

This non-provisional patent application claims priority from Korean Patent Application No. 10-2021-0080489, filed on Jun. 22, 2021, in the Korean Intellectual Property Office, the disclosure of which is incorporated herein by reference in its entirety.

BACKGROUND

1. Field

Embodiments relate to a semiconductor device including a bonding enhancement layer and a method of forming the same.

2. Description of the Related Art

In accordance with high integration of a semiconductor device, research on technology for bonding a second substrate onto a first substrate is being conducted.

SUMMARY

The embodiments may be realized by providing a semiconductor device including a first structure including a first dielectric layer and a first conductive pattern in the first dielectric layer, the first conductive pattern including a first conductive material and a first bonding enhancement material; a second structure including a second dielectric layer and a second conductive pattern in the second dielectric layer, the second dielectric layer directly contacting the first dielectric layer thereunder, the second conductive pattern directly contacting the first conductive pattern thereunder; and a first bonding enhancement layer between the first conductive pattern and the second dielectric layer, wherein the first bonding enhancement layer includes the first bonding enhancement material or a material included in the second dielectric layer, and the first bonding enhancement material includes a material having a higher bonding force to the material included in the second dielectric layer than a bonding force of the first conductive material to the material included in the second dielectric layer.

The embodiments may be realized by providing a semiconductor device including a first substrate; a first structure on the first substrate, the first structure including a first dielectric layer and a first conductive pattern in the first dielectric layer, the first conductive pattern including a first conductive material and a first bonding enhancement material; a second substrate on the first structure; a second structure between the first structure and the second substrate, the second structure including a second dielectric layer and a second conductive pattern in the second dielectric layer, the second dielectric layer directly contacting the first dielectric layer thereunder, the second conductive pattern directly contacting the first conductive pattern thereunder, and the second conductive pattern including a second conductive material and a second bonding enhancement material; a first bonding enhancement layer between the first conductive pattern and the second dielectric layer; and a second bonding enhancement layer between the second conductive pattern and the first dielectric layer, wherein the first bonding enhancement layer includes the first bonding enhancement material or a material included in the second dielectric layer, the second bonding enhancement layer includes the second bonding enhancement material or a material included in the first dielectric layer, the first bonding enhancement material includes a material having a higher bonding force to the material included in the second dielectric layer than a bonding force of the first conductive material to the material included in the second dielectric layer, and the second bonding enhancement material includes a material having a higher bonding force to the material included in the first dielectric layer than a bonding force of the second conductive material to the material included in the first dielectric layer.

The embodiments may be realized by providing a semiconductor device including a first substrate; a first structure on the first substrate, the first structure including a first dielectric layer and a first shielding pattern in the first dielectric layer, the first shielding pattern including a first conductive material and a first bonding enhancement material; a second substrate on the first structure; a plurality of photodiodes in the second substrate; a second structure between the first structure and the second substrate, the second structure including a second dielectric layer and a second shielding pattern in the second dielectric layer, the second dielectric layer directly contacting the first dielectric layer thereunder, the second shielding pattern directly contacting the first shielding pattern thereunder, and the second shielding pattern including a second conductive material and a second bonding enhancement material; a first bonding enhancement layer between the first shielding pattern and the second dielectric layer; and a second bonding enhancement layer between the second shielding pattern and the first dielectric layer, wherein the first bonding enhancement layer includes the first bonding enhancement material or a material included in the second dielectric layer, the second bonding enhancement layer includes the second bonding enhancement material or a material included in the first dielectric layer, the first bonding enhancement material includes a material having a higher bonding force to the material included in the second dielectric layer than a bonding force of the first conductive material to the material included in the second dielectric layer, and the second bonding enhancement material includes a material having a higher bonding force to the material included in the first dielectric layer than a bonding force of the second conductive material to the material included in the first dielectric layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 9:
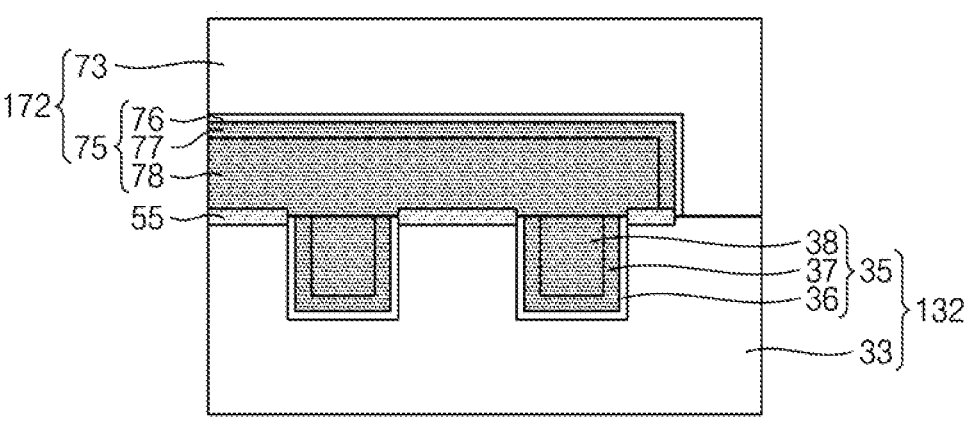
FIG. 9 is an enlarged view showing a portion of FIG. 8.
Figure 10:
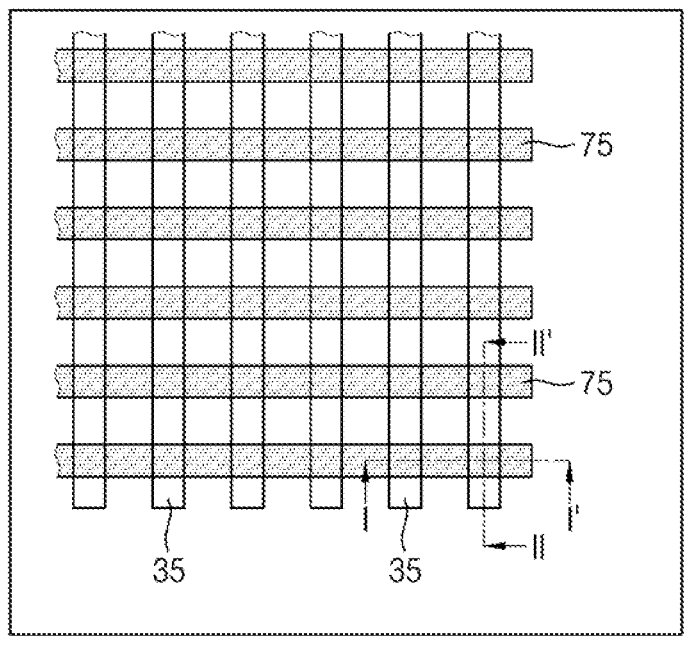
FIG. 10 is a layout view of a semiconductor device according to exemplary embodiments of the disclosure.

FIGS. 1 to 8 are cross-sectional views of a semiconductor device according to exemplary embodiments of the disclosure. FIG. 9 is an enlarged view showing a portion 150 of FIG. 8. FIG. 10 is a layout view of a semiconductor device according to exemplary embodiments of the disclosure. In an embodiment, FIGS. 1 to 7 may be cross-sectional views taken along lines I-I' and II-IF in FIG. 10. In an implementation, a semiconductor device according to exemplary embodiments of the disclosure may include a back side illumination CMOS image sensor (CIS).

Figure 1:
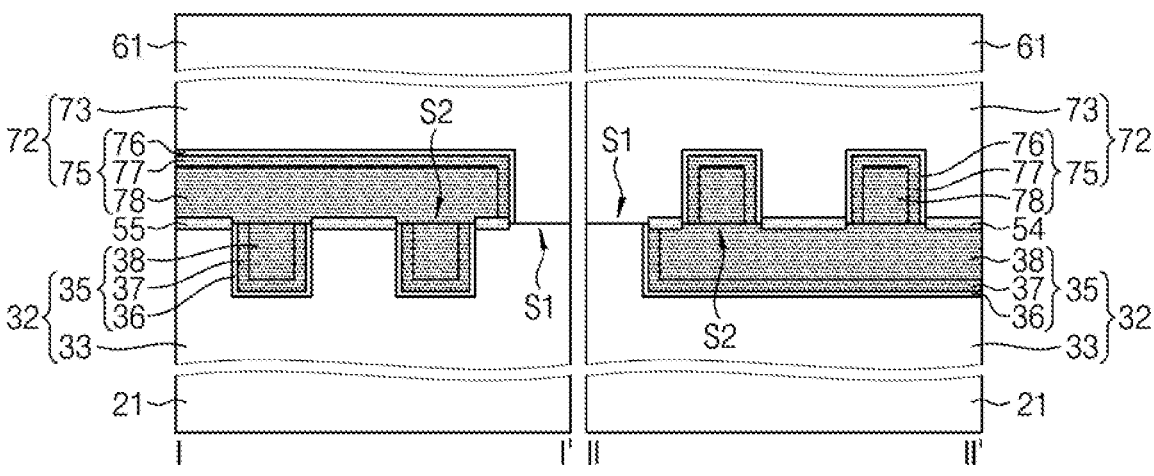
FIGS. 1 to 8 are cross-sectional views of a semiconductor device according to exemplary embodiments of the disclosure.

Referring to FIG. 1, the semiconductor device according to the exemplary embodiments of the disclosure may include a first substrate 21, a first structure 32 on the first substrate 21, a first bonding enhancement layer 54, a second bonding enhancement layer 55, a second substrate 61, and a second structure 72 on the second substrate 61. The second structure 72 may be bonded onto the first structure 32. The first bonding enhancement layer 54 and the second bonding enhancement layer 55 may be between the first structure 32 and the second structure 72. The first bonding enhancement layer 54 and the second bonding enhancement layer 55 may help increase the bonding strength between the first structure 32 and the second structure 72.

The first structure 32 may include a first dielectric layer 33 and a first conductive pattern 35 in the first dielectric layer 33. The first conductive pattern 35 may include a first barrier layer 36, a first seed layer 37 on the first barrier layer 36, and a first conductive layer 38 on the first seed layer 37. The second structure 72 may include a second dielectric layer 73 and a second conductive pattern 75 in the second dielectric layer 73. The second conductive pattern 75 may include a second barrier layer 76, a second seed layer 77 on the second barrier layer 76, and a second conductive layer 78 on the second seed layer 77.

The first dielectric layer 33 may include a single layer or multiple layers. The first dielectric layer 33 may include, e.g., low-k dielectrics, high-k dielectrics, or a combination thereof. In an implementation, the first dielectric layer 33 may include at least two of, e.g., Si, O, N, B, and C. In an implementation, the first dielectric layer 33 may include, e.g., silicon oxide, silicon oxynitride, silicon oxycarbonitride (SiOCN), or a combination thereof. The second dielectric layer 73 may include a single layer or multiple layers. The second dielectric layer 73 may include, e.g., low-k dielectrics, high-k dielectrics, or a combination thereof. In an implementation, the second dielectric layer 73 may include at least two of, e.g., Si, O, N, B, and C. In an implementation, the second dielectric layer 73 may include silicon oxide, silicon oxynitride, silicon oxycarbonitride (SiOCN), or a combination thereof. In an implementation, the second dielectric layer 73 may include the same material as the first dielectric layer 33. As used herein, the term "or" is not an exclusive term, e.g., "A or B" would include A, B, or A and B.

The first barrier layer 36 may surround side surfaces and a bottom surface (e.g., outer surfaces) of the first conductive layer 38. The first barrier layer 36 may include, e.g., Ti, TiN, Ta, TaN, or a combination thereof. The first seed layer 37 may surround the side surfaces and the bottom surface of the first conductive layer 38. The first seed layer 37 may be between the first barrier layer 36 and the first conductive layer 38. Each of the first seed layer 37 and the first conductive layer 38 may include a first conductive material and a first bonding enhancement material. A content (e.g., in terms of wt %) of the first bonding enhancement material in the first seed layer 37 may be smaller than a content (wt %) of the first conductive material in the first seed layer 37. The content (wt %) of the first bonding enhancement material in the conductive layer 38 may be smaller than the content (wt %) of the first conductive material in the first conductive layer 38.

The first conductive material may include a material having lower resistivity than the first bonding enhancement material. The first conductive material may include a material having higher current drivability than the first bonding enhancement material. The first bonding enhancement material may include a material having a high bonding force to a material included in the second dielectric layer 73. The first bonding enhancement material may include a material having a high bonding force to oxygen (O). In an implementation, the first bonding enhancement material may include a material having a higher bonding force to the material included in the second dielectric layer 73 than the first conductive material (e.g., a bonding force of the first bonding enhancement material to the material included in the second dielectric layer may be greater than a bonding force of the first conductive material to the material included in the second dielectric layer). The first bonding enhancement material may include a material having a higher bonding force to oxygen (O) than the first conductive material (e.g., a bonding force of the first bonding enhancement material to oxygen may be greater than a bonding force of the first conductive material to oxygen). In an implementation, the first conductive material may include Cu, and the first bonding enhancement material may include Mn.

In an implementation, the first seed layer 37 may include, e.g., CuMn. The content (wt %) of Mn in the first seed layer 37 may be smaller than the content (wt %) of Cu in the first seed layer 37. The content of Mn in the first seed layer 37 may be, e.g., more than 0 wt %, and not more than 5 wt % (e.g., greater than 0 wt % to 5 wt %). In an implementation, the content of Mn in the first seed layer 37 may be about 2 wt %. In an implementation, the first conductive layer 38 may include, e.g., CuMn. The content (wt %) of Mn in the first conductive layer 38 may be smaller than the content (wt %) of Cu in the first conductive layer 38. The content of Mn in the first conductive layer 38 may be, e.g., more than 0 wt %, and not more than 5 wt %. In an implementation, the content of Mn in the first conductive layer 38 may be about 2 wt %.

The second barrier layer 76 may surround side surfaces and a bottom surface (e.g., outer surfaces) of the second conductive layer 78. The second barrier layer 76 may include, e.g., Ti, TiN, Ta, TaN, or a combination thereof. The second seed layer 77 may surround the side surfaces and the bottom surface of the second conductive layer 78. The second seed layer 77 may be between the second barrier layer 76 and the second conductive layer 78. Each of the second seed layer 77 and the second conductive layer 78 may include a second conductive material and a second bonding enhancement material. The content (wt %) of the second bonding enhancement material in the second seed layer 77 may be smaller than the content (wt %) of the second conductive material in the second seed layer 77. The content (wt %) of the second bonding enhancement material in the second conductive layer 78 may be smaller than the content (wt %) of the second conductive material in the second conductive layer 78.

The second conductive material may include a material having lower resistivity than the second bonding enhancement material. The second conductive material may include a material having higher or superior current drivability than the second bonding enhancement material. The second bonding enhancement material may include a material having a high bonding force to a material included in the first dielectric layer 33. The second bonding enhancement material may include a material having a high bonding force to oxygen (O). In an implementation, the second bonding enhancement material may include a material having a higher bonding force to the material included in the first dielectric layer 33 than the second conductive material. The second bonding enhancement material may include a material having a higher bonding force to oxygen (O) than the second conductive material. In an implementation, the second conductive material may include Cu, and the second bonding enhancement material may include Mn.

In an implementation, the second seed layer 77 may include, e.g., CuMn. The content (wt %) of Mn in the second seed layer 77 may be smaller than the content (wt %) of Cu in the second seed layer 77. The content of Mn in the second seed layer 77 may be more than 0 wt %, and not more than 5 wt %. In an implementation, the content of Mn in the second seed layer 77 may be about 2 wt %. In an implementation, the second conductive layer 78 may include, e.g., CuMn. The content (wt %) of Mn in the second conductive layer 78 may be smaller than the content (wt %) of Cu in the second conductive layer 78. The content of Mn in the second conductive layer 78 may be more than 0 wt %, and not more than 5 wt %. In an implementation, the content of Mn in the second conductive layer 78 may be about 2 wt %.

The second dielectric layer 73 may directly contact the first dielectric layer 33 thereunder. A first interface S1 may be formed between the first dielectric layer 33 and the second dielectric layer 73. The second conductive pattern 75 may overlap with the first conductive pattern 35 thereunder. The second conductive pattern 75 may directly contact the first conductive pattern 35 thereunder. A second interface S2 may be formed between the first conductive pattern 35 and the second conductive pattern 75. The first interface S1 and the second interface S2 may be substantially coplanar with each other.

At least a portion of the first conductive pattern 35 may overlap with the second dielectric layer 73. The first bonding enhancement layer 54 may be between the first conductive pattern 35 and the second dielectric layer 73. The first bonding enhancement layer 54 may directly contact the first conductive pattern 35 and may directly contact the second dielectric layer 73. A top surface of the first bonding enhancement layer 54 may be at a higher level than (e.g., farther from the first substrate 21 than) the first interface S1 and the second interface S2. A bottom surface of the first bonding enhancement layer 54 may be at a lower level than (e.g., closer to the first substrate 21 than) the first interface S1 and the second interface S2. The first bonding enhancement layer 54 may be between the second dielectric layer 73 and the first conductive layer 38 and between the second dielectric layer 73 and the first seed layer 37.

In an implementation, the first bonding enhancement layer 54 may include at least two of materials included in the first seed layer 37, the first conductive layer 38, and the second dielectric layer 73. In an implementation, the first bonding enhancement layer 54 may include at least two of materials included in the second dielectric layer 73 and the first bonding enhancement material. The first bonding enhancement layer 54 may include at least one of the first bonding enhancement material and at least one of the materials included in the second dielectric layer 73. The first bonding enhancement layer 54 may include an oxide of the first bonding enhancement material, a silicate of the first bonding enhancement material, or a combination thereof. The first bonding enhancement layer 54 may include, e.g., MnSiO, MnO, CuMnO, CuMnSiO, or a combination thereof. In an implementation, the first bonding enhancement layer 54 may include, e.g., MnSiO. The thickness of the first bonding enhancement layer 54 may be greater than 0 nm, and not greater than 1 nm. In an implementation, the thickness of the first bonding enhancement layer 54 may be about 0.5 nm.

At least a portion of the second conductive pattern 75 may overlap with the first dielectric layer 33. The second bonding enhancement layer 55 may be between the second conductive pattern 75 and the first dielectric layer 33. The second bonding enhancement layer 55 may directly contact the second conductive pattern 75 and may directly contact the first dielectric layer 33. A top surface of the second bonding enhancement layer 55 may be at a higher level than the first interface S1 and the second interface S2. A bottom surface of the second bonding enhancement layer 55 may be at a lower level than the first interface S1 and the second interface S2. The second bonding enhancement layer 55 may be between the first dielectric layer 33 and the second conductive layer 38 and between the first dielectric layer 33 and the second seed layer 77.

The second bonding enhancement layer 55 may include at least two of materials included in the second seed layer 77, the second conductive layer 78, and the first dielectric layer 33. The second bonding enhancement layer 55 may include at least two of the second bonding enhancement material and the materials included in the first dielectric layer 33. The second bonding enhancement layer 55 may include at least one of the second bonding enhancement material and at least one of the materials included in the first dielectric layer 33. The second bonding enhancement layer 55 may include an oxide of the second bonding enhancement material, a silicate of the second bonding enhancement material, or a combination thereof. The second bonding enhancement layer 55 may include, e.g., MnSiO, MnO, CuMnO, CuMnSiO, or a combination thereof. In an implementation, the second bonding enhancement layer 55 may include MnSiO. The thickness of the second bonding enhancement layer 55 may be greater than 0 nm, and not greater than 1 nm. In an implementation, the thickness of the second bonding enhancement layer 55 may be about 0.5 nm.

Figure 2:
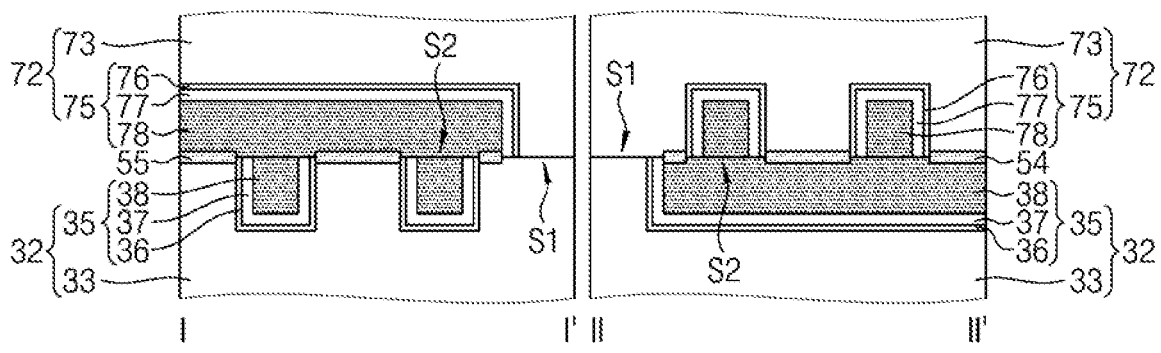

Referring to FIG. 2, a first seed layer 37 may include a first conductive material. A first conductive layer 38 may include the first conductive material and a first bonding enhancement material. A second seed layer 77 may include a second conductive material. A second conductive layer 78 may include the second conductive material and a second bonding enhancement material. A first bonding enhancement layer 54 may be between a second dielectric layer 73 and the first conductive layer 38. The first seed layer 37 may directly contact the second dielectric layer 73. A second bonding enhancement layer 55 may be between a first dielectric layer 33 and the second conductive layer 78. The second seed layer 77 may directly contact the first dielectric layer 33.

Figure 3:
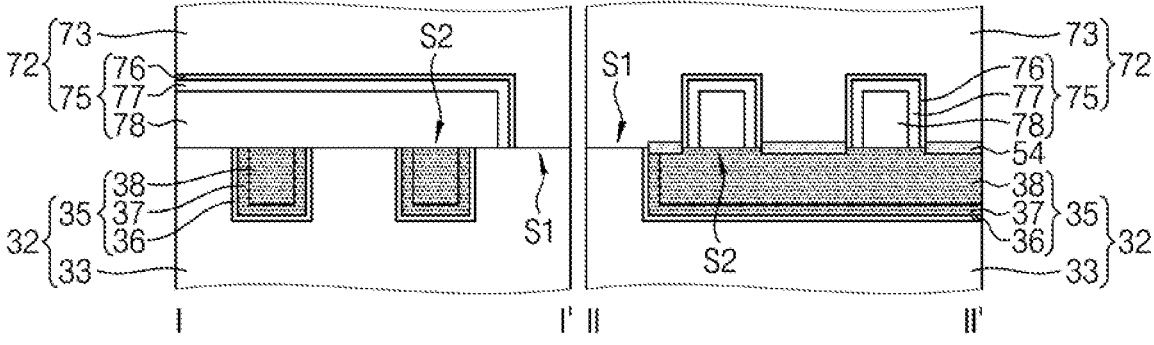

Referring to FIG. 3, each of a first seed layer 37 and a first conductive layer 38 may include a first conductive material and a first bonding enhancement material. Each of a second seed layer 77 and a second conductive layer 78 may include a second conductive material. A first bonding enhancement layer 54 may be between a second dielectric layer 73 and the first conductive layer 38 and between the second dielectric layer 73 and the first seed layer 37. At least a portion of a second conductive pattern 75 may overlap with a first dielectric layer 33. Each of a second barrier layer 76, the second seed layer 77, and the second conductive layer 78 may directly contact the first dielectric layer 33.

Figure 4:
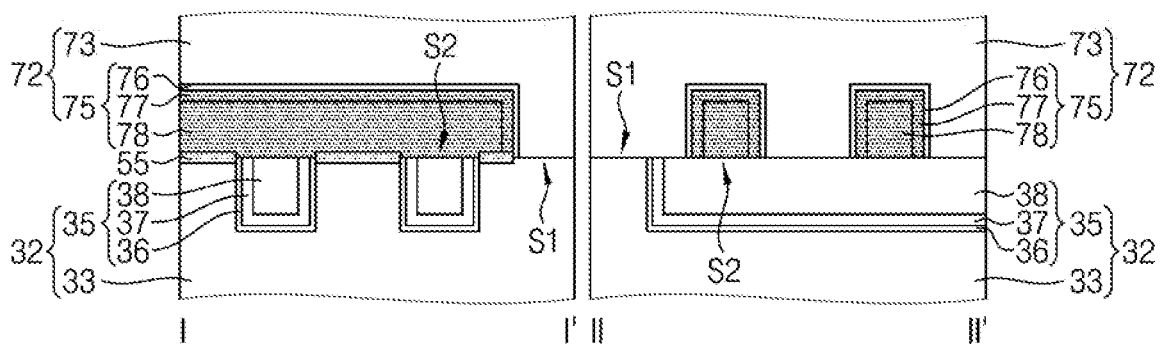

Referring to FIG. 4, each of a first seed layer 37 and a first conductive layer 38 may include a first conductive material. Each of a second seed layer 77 and a second conductive layer 78 may include a second conductive material and a second bonding enhancement material. A second bonding enhancement layer 55 may be between a first dielectric layer 33 and the second conductive layer 78 and between the first dielectric layer 33 and the second seed layer 77. At least a portion of a first conductive pattern 35 may overlap with a second dielectric layer 73. Each of a first barrier layer 36, the first seed layer 37, and the first conductive layer 38 may directly contact the second dielectric layer 73.

Figure 5:
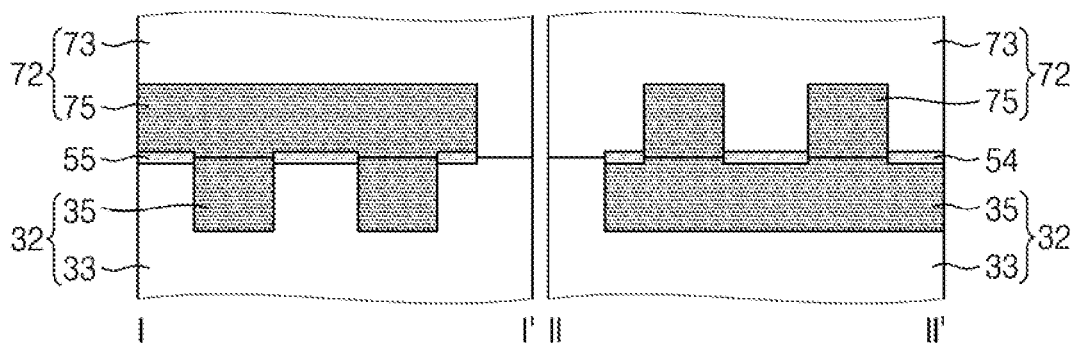

Referring to FIG. 5, a first conductive pattern 35 may include a first conductive material and a first bonding enhancement material. A second conductive pattern 75 may include a second conductive material and a second bonding enhancement material. At least a portion of the first conductive pattern 35 may overlap with a second dielectric layer 73. A first bonding enhancement layer 54 may be between the first conductive pattern 35 and the second dielectric layer 73. The first bonding enhancement layer 54 may directly contact the first conductive pattern 35 and the second dielectric layer 73. At least a portion of the second conductive pattern 75 may overlap with a first dielectric layer 33. A second bonding enhancement layer 55 may be between the second conductive pattern 75 and the first dielectric layer 33. The second bonding enhancement layer 55 may directly contact the second conductive pattern 75 and the first dielectric layer 33.

Figure 6:
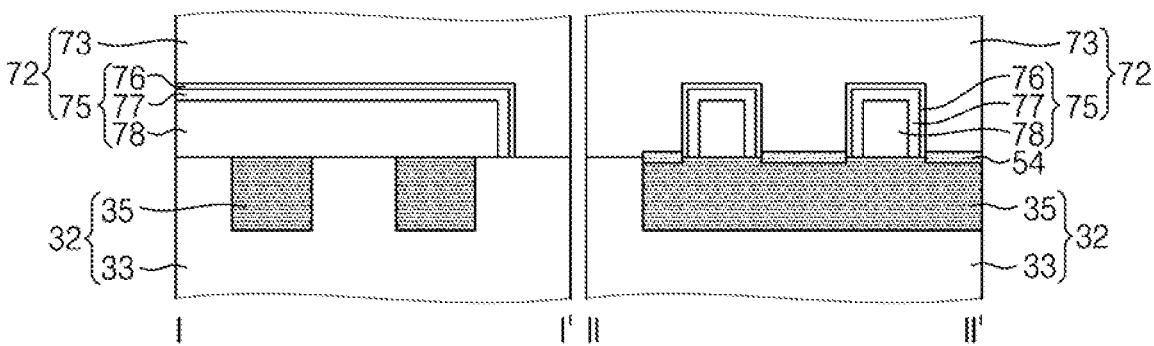

Referring to FIG. 6, a first conductive pattern 35 may include a first conductive material and a first bonding enhancement material. Each of a second seed layer 77 and a second conductive layer 78 may include a second conductive material. A first bonding enhancement layer 54 may be between the first conductive pattern 35 and a second dielectric layer 73. The first bonding enhancement layer 54 may directly contact the first conductive pattern 35 and the second dielectric layer 73. Each of a second barrier layer 76, the second seed layer 77, and the second conductive layer 78 may directly contact a first dielectric layer 33.

Figure 7:
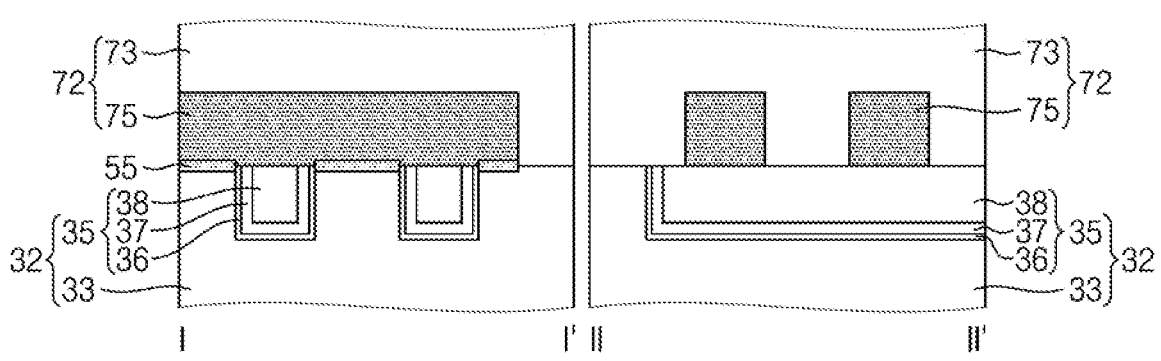

Referring to FIG. 7, each of a first seed layer 37 and a first conductive layer 38 may include a first conductive material. A second conductive pattern 75 may include a second conductive material and a second bonding enhancement material. A second bonding enhancement layer 55 may be between a first dielectric layer 33 and the second conductive pattern 75. Each of a first barrier layer 36, the first seed layer 37, and the first conductive layer 38 may directly contact a second dielectric layer 73.

Figure 8:
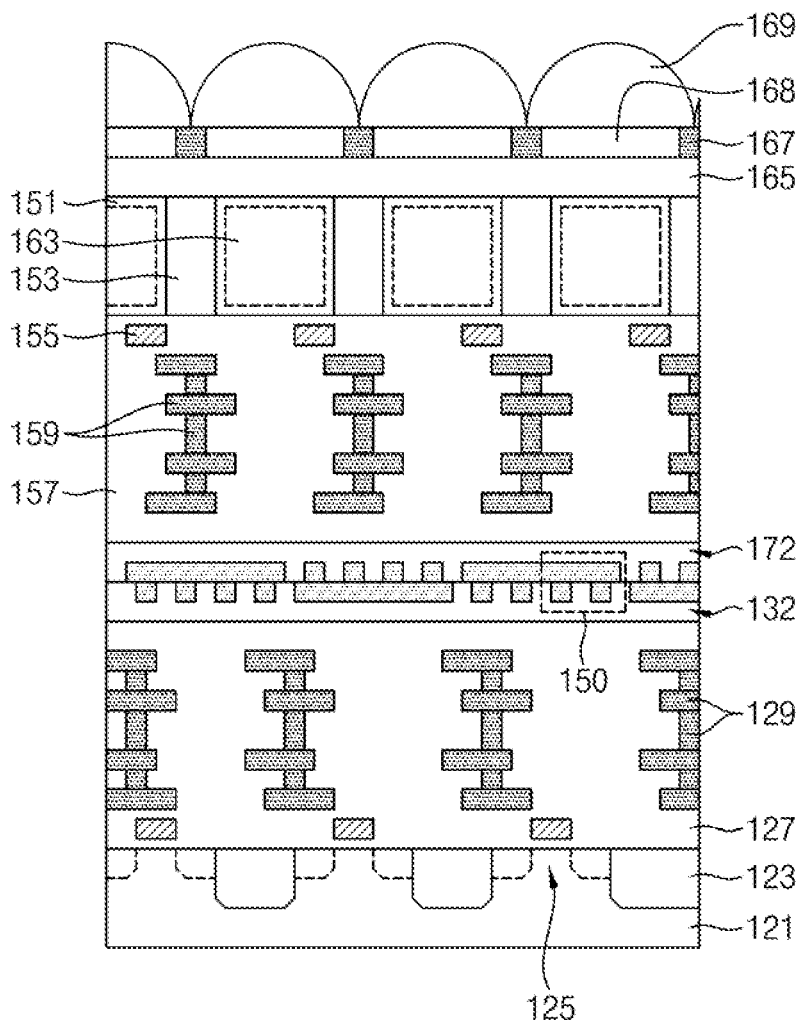

Referring to FIG. 8, a semiconductor device according to exemplary embodiments of the disclosure may include a first substrate 121, a lower element isolation layer 123, a plurality of lower transistors 125, a lower insulating layer 127, lower wiring structures 129, a first structure 132, a second substrate 151, an upper element isolation layer 153, a plurality of upper transistors 155, an upper insulating layer 157, upper wiring structures 159, a second structure 172, a plurality of photodiodes 163, an upper capping layer 165, a light shield pattern 167, a plurality of color filters 168, and a plurality of microlenses 169. The plurality of photodiodes 163, the plurality of color filters 168, and the plurality of microlenses 169 may constitute a plurality of pixels.

In an implementation, the second substrate 151 may be on the first substrate 121. The lower element isolation layer 123 may be in the first substrate 121. The plurality of lower transistors 125 may be on the first substrate 121. The lower insulating layer 127 may be between the first substrate 121 and the second substrate 151. The plurality of lower wiring structures 129 may be in the lower insulating layer 127. The first structure 132 may be between the lower insulating layer 127 and the second substrate 151.

The second structure 172 may be between the first structure 132 and the second substrate 151. The upper insulating layer 157 may be between the second structure 172 and the second substrate 151. The plurality of upper transistors 155 and the upper wiring structures 159 may be in the upper insulating layer 157. The plurality of upper transistors 155 may correspond to a transfer transistor. The plurality of photodiodes 163 may be in the second substrate 151. The upper element isolation layer 153, which extends through the second substrate 151, may be among or adjacent to the plurality of photodiodes 163.

The upper capping layer 165 may cover the second substrate 151 and the upper element isolation layer 153. The light shield pattern 167 and the plurality of color filters 168 may be on the upper capping layer 165. The plurality of microlenses 169 may be on the plurality of color filters 168.

The first structure 132 and the second structure 172 may include configurations similar to the configurations of the first structure 32 and the second structure 72 described with reference to FIGS. 1 to 7. Configurations similar to the first bonding enhancement layer 54 and the second bonding enhancement layer 55 described with reference to FIGS. 1 to 7 may be between the first structure 132 and the second structure 172.

Each of the first substrate 121 and the second substrate 151 may include a semiconductor substrate such as a silicon wafer or a silicon-on-insulator (SOI) wafer. Each of the lower element isolation layer 123, the lower insulating layer 127, the upper element isolation layer 153, and the upper insulating layer 157 may include low-k dielectrics, high-k dielectrics, or a combination thereof. Each of the lower element isolation layer 123, the lower insulating layer 127, the upper element isolation layer 153, and the upper insulating layer 157 may include at least two of Si, O, N, B, and C. In an implementation, each of the lower element isolation layer 123, the lower insulating layer 127, the upper element isolation layer 153, and the upper insulating layer 157 may include, e.g., silicon oxide, silicon nitride, silicon oxynitride, silicon oxycarbonitride (SiOCN), or a combination thereof.

Each of the plurality of lower transistors 125 and the plurality of upper transistors 155 may include a fin field effect transistor (FinFET), a multi-bridge channel transistor such as an MBCFET®, a nanowire transistor, a vertical transistor, a recess channel transistor, a 3-D transistor, a planar transistor, or a combination thereof. Each of the lower wiring structures 129 and the upper wiring structures 159 may include connecting layers between a plurality of conductive layers, and connecting layers among the conductive layers. Each of the lower wiring structures 129 and the upper wiring structures 159 may include a conductive material such as metal, metal oxide, metal nitride, metal silicide, polysilicon, conductive carbon, or a combination thereof.

Each of the plurality of photodiodes 163 may include an N-type impurity region and a P-type impurity region. The upper capping layer 165 may include silicon oxide, silicon nitride, silicon oxynitride, silicon oxycarbonitride (SiOCN), low-k dielectrics, high-k dielectrics, or a combination thereof. In an implementation, the upper capping layer 165 may include metal oxide or metal fluoride including Hf, Zr, Al, Ta, Ti, Y, or a lanthanoid. In an implementation, the upper capping layer 65 may include hafnium oxide (HfO), aluminum fluoride (AlF), or a combination thereof. The light shield pattern 167 may include a conducive material such as metal, metal oxide, metal nitride, metal silicide, polysilicon, conductive carbon, or a combination thereof.

Referring to FIG. 9, in an embodiment, the first structure 132 may include the first dielectric layer 33 and the first conductive pattern 35. The first conductive pattern 35 may include the first barrier layer 36, the first seed layer 37, and the first conductive layer 38. The second structure 172 may include the second dielectric layer 73 and the second conductive pattern 75. The second conductive pattern 75 may include the second barrier layer 76, the second seed layer 77, and the second conductive layer 78. The second bonding enhancement layer 55 may be between the second conductive pattern 75 and the first dielectric layer 33.

In an implementation, the first conductive pattern 35 and the second conductive pattern 75 may function as a shielding layer. The first conductive pattern 35 and the second conductive pattern 75 may function to shield light (or scatter light) having influence on the plurality of photodiodes 163 or to shield an electrical signal having influence on the plurality of photodiodes 163. The first conductive pattern 35 and the second conductive pattern 75 may be grounded.

Referring to FIG. 10, a semiconductor device according to exemplary embodiments of the disclosure may include a plurality of first conductive patterns 35 and a plurality of second conductive patterns 75. The plurality of first conductive patterns 35 may be disposed in parallel. The plurality of second conductive patterns 75 may be disposed in parallel. The plurality of second conductive patterns 75 may intersect the plurality of first conductive patterns 35. In an implementation, the plurality of first conductive patterns 35 and the plurality of second conductive patterns 75 may form a grid shape.

In an implementation, each of the plurality of first conductive patterns 35 may have a bar shape, a quadrangular shape, a circular shape, a polygonal shape, an amoeba shape, a grid shape, or a combination thereof. Each of the plurality of second conductive patterns 75 may have a bar shape, a quadrangular shape, a circular shape, a polygonal shape, an amoeba shape, a grid shape, or a combination thereof.

In an implementation, the plurality of first conductive patterns 35 and the plurality of second conductive patterns 75 may function as a shielding layer. The plurality of first conductive patterns 35 may correspond to a first shielding layer or a first shielding pattern, and the plurality of second conductive patterns 75 may correspond to a second shielding layer or a second shielding pattern.

FIGS. 11 to 17 are cross-sectional view taken along lines I-I' and II-IF in FIG. 10 of stages in a semiconductor device forming method according to exemplary embodiments of the disclosure. In an implementation, the semiconductor device forming method according to the exemplary embodiments of the disclosure may include a wafer bonding method.

Figure 11:
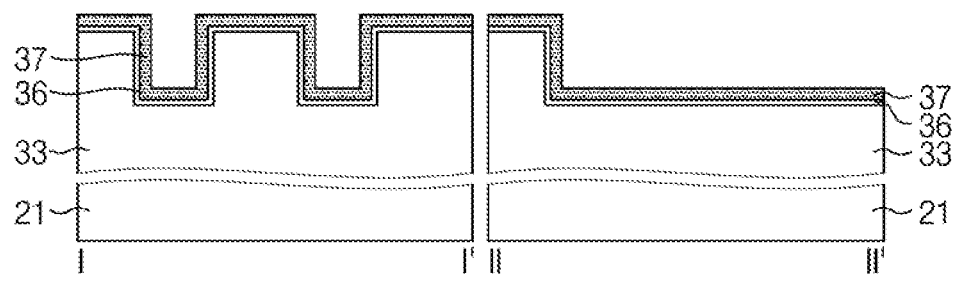
FIGS. 11 to 17 are cross-sectional view of stages in a semiconductor device forming method according to exemplary embodiments of the disclosure.

Referring to FIG. 11, a first dielectric layer 33 may be formed on a first substrate 21. A first barrier layer 36 and a first seed layer 37 may be sequentially stacked on the first dielectric layer 33. The first substrate 21 may include a semiconductor substrate such as a silicon wafer or a silicon-on-insulator (SOI) wafer. In an implementation, various kinds of semiconductor devices such as a plurality of active/passive devices, a volatile memory device, a non-volatile memory device, or a combination thereof may be additionally (or independently) formed in the first substrate 21 and/or on the first substrate 21.

The first dielectric layer 33 may cover the first substrate 21 thereunder. In an implementation, various structures such as a plurality of trenches, a plurality of grooves, a plurality of holes, or a combination thereof may be formed at an upper portion of the first dielectric layer 33. A top surface of the first dielectric layer 33 may include grooves and protrusions. The first barrier layer 36 and the first seed layer 37 may conformally cover the first dielectric layer 33 thereunder. Each of the first barrier layer 36 and the first seed layer 37 may be formed using a chemical vapor deposition (CVD) method, a physical vapor deposition (PVD) method, an atomic layer deposition (ALD) method, a cyclic deposition method, or a combination thereof. In an implementation, the first seed layer 37 may include a first conductive material, a first bonding enhancement material, or a combination thereof. In an implementation, the first seed layer 37 may include the first conductive material and the first bonding enhancement material.

Figure 12:
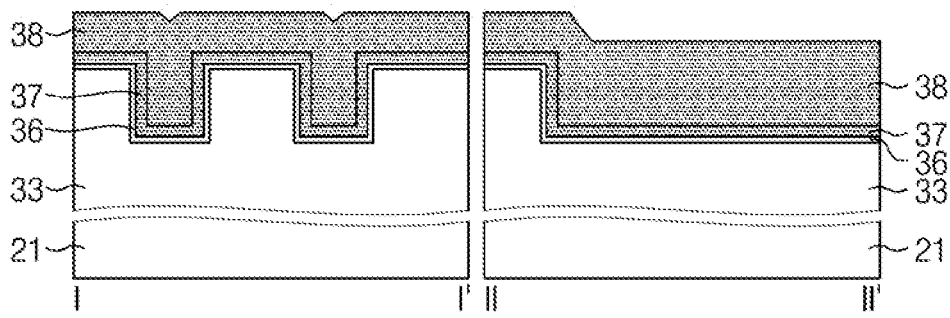

Referring to FIG. 12, a first conductive layer 38 may be formed on the first seed layer 37. The first conductive layer 38 may be formed using an electroplating method, a chemical vapor deposition (CVD) method, a physical vapor deposition (PVD) method, an atomic layer deposition (ALD) method, a cyclic deposition method, or a combination thereof. In an implementation, the first conductive layer 38 may include the first conductive material, the first bonding enhancement material, or a combination thereof. In an implementation, the first conductive layer 38 may include the first conductive material and the first bonding enhancement material. In an implementation, the first conductive layer 38 may include a CuMn layer formed by an electroplating method.

Figure 13:
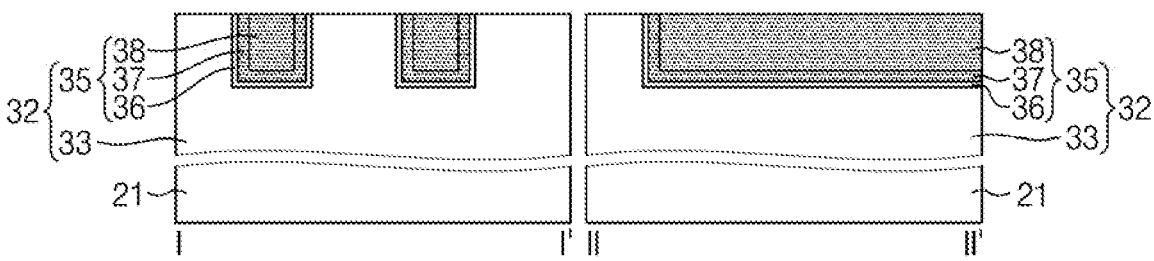

Referring to FIG. 13, the first barrier layer 36, the first seed layer 37 and the first conductive layer 38 may be partially removed, thereby exposing the top surface of the first dielectric layer 33. Partial removal of the first barrier layer 36, the first seed layer 37 and the first conductive layer 38 may include a planarization process such as a chemical mechanical polishing (CMP) process, an etch-back process, or a combination thereof. The first barrier layer 36, the first seed layer 37, and the first conductive layer 38 may remain in the first dielectric layer 33. The top surface of the first dielectric layer 33 and top surfaces of the first barrier layer 36, the first seed layer 37 and the first conductive layer 38 may be exposed in substantially the same plane. The first barrier layer 36, the first seed layer 37, and the first conductive layer 38 may constitute a first conductive pattern 35. The first dielectric layer 33 and the first conductive pattern 35 may constitute a first structure 32.

Figure 14:
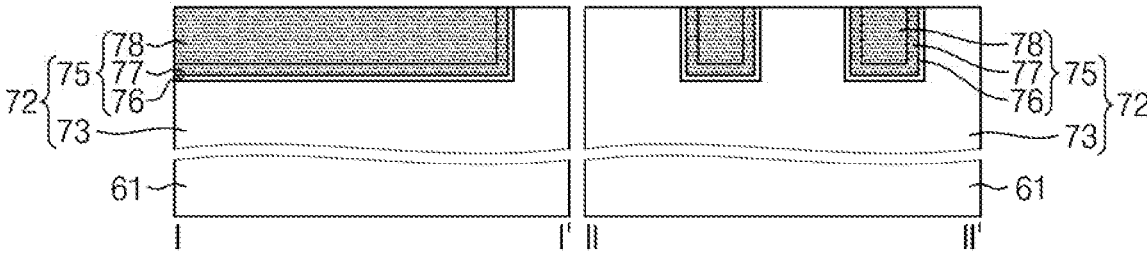

Referring to FIG. 14, a second structure 72 may be formed on a second substrate 61 using a method similar to the method described with reference to FIGS. 1 to 13. The second structure 72 may include a second dielectric layer 73 and a second conductive pattern 75. The second conductive pattern 75 may include a second barrier layer 76, a second seed layer 77, and a second conductive layer 78. Top surfaces of the second dielectric layer 73, the second barrier layer 76, the second seed layer 77, and the second conductive layer 78 may be exposed in substantially the same plane.

Figure 15:
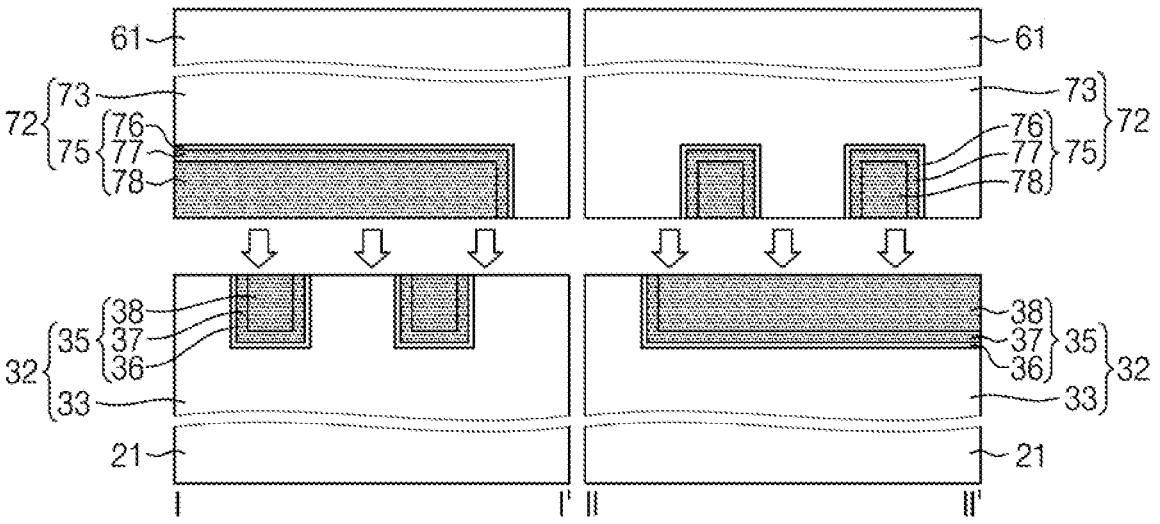

Referring to FIG. 15, the second substrate 61 may be bonded onto the first substrate 21. The first structure 32 and the second structure 72 may be between the first substrate 21 and the second substrate 61.

Figure 16:
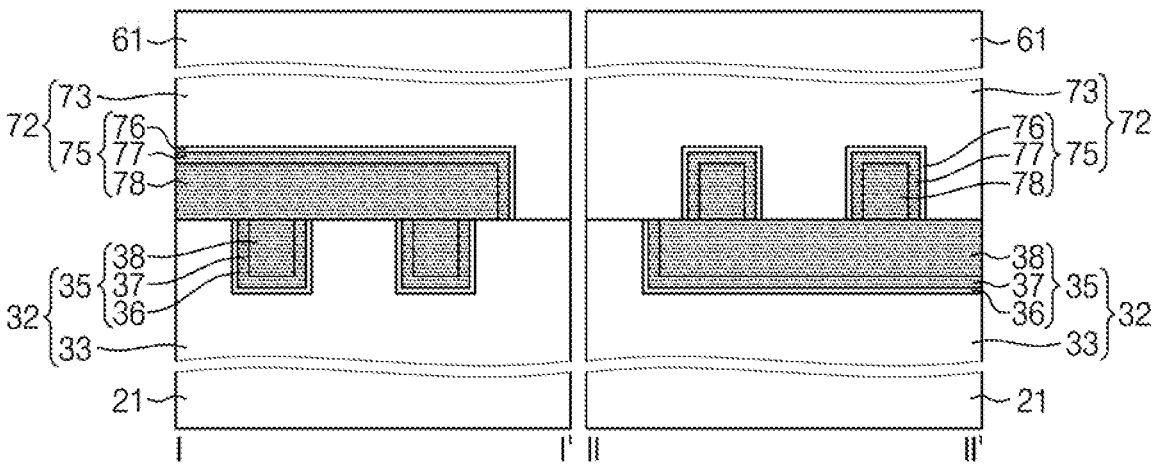

Referring to FIG. 16, the second structure 72 may be bonded onto the first structure 32. The second dielectric layer 73 may directly contact the first dielectric layer 33 thereunder. At least a portion of the second conductive pattern 75 may overlap with the first conductive pattern 35 thereunder. The second conductive pattern 75 may directly contact the first conductive pattern 35 thereunder. At least a portion of the first conductive pattern 35 may overlap with the second dielectric layer 73. At least a portion of the first conductive pattern 35 may directly contact the second dielectric layer 73. At least a portion of the second conductive pattern 75 may overlap with the first dielectric layer 33. At least a portion of the second conductive pattern 75 may directly contact the first dielectric layer 33 thereunder.

Figure 17:
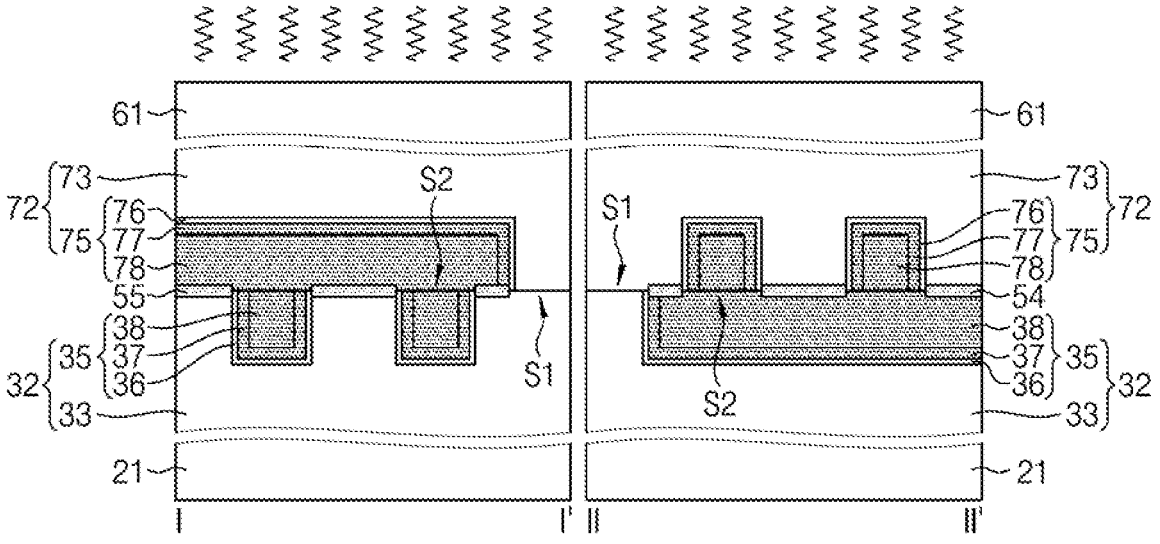

Referring to FIG. 17, a first bonding enhancement layer 54 may be formed between the first conductive pattern 35 and the second dielectric layer 73 by performing a thermal treatment process or an oxidation process, and a second bonding enhancement layer 55 may be formed between the second conductive pattern 75 and the first dielectric layer 33. In an implementation, the thermal treatment process for formation of the first bonding enhancement layer 54 and the second bonding enhancement layer 55 may be performed in an atmosphere at a temperature of 200° C. to 600° C. In an implementation, the thermal treatment process for formation of the first bonding enhancement layer 54 and the second bonding enhancement layer 55 may be performed in an atmosphere at a temperature of about 250° C.

The first bonding enhancement layer 54 may directly contact the first conductive pattern 35 and the second dielectric layer 73. The first bonding enhancement layer 54 may be formed between the second dielectric layer 73 and the first conductive layer 38 and between the second dielectric layer 73 and the first seed layer 37. The second bonding enhancement layer 55 may directly contact the second conductive pattern 75 and the first dielectric layer 33. The second bonding enhancement layer 55 may be formed between the first dielectric layer 33 and the second conductive layer 78 and between the first dielectric layer 33 and the second seed layer 77. Each of the first bonding enhancement layer 54 and the second bonding enhancement layer 55 may include a configuration similar to the configuration described with reference to FIGS. 1 to 16.

By way of summation and review, each of a first substrate and a second substrate may include a plurality of active/passive devices. Due to physical and chemical configurations of the plurality of active/passive devices, the bonding strength between the first substrate and the second substrate may be varied.

One or more embodiments may provide a semiconductor device capable of increasing the bonding strength between structures.

In accordance with the exemplary embodiments of the disclosure, a first bonding enhancement layer and a second bonding enhancement layer may be provided between a first structure and a second structure. The bonding strength between the first structure and the second structure may be increased by virtue of the first bonding enhancement layer and the second bonding enhancement layer. A semiconductor device having excellent bonding strength among a plurality of structure may be realized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first structure including a first dielectric layer and a first conductive pattern in the first dielectric layer, the first conductive pattern including a first conductive material and a first bonding enhancement material;
a second structure including a second dielectric layer and a second conductive pattern in the second dielectric layer, the second dielectric layer directly contacting the first dielectric layer thereunder, the second conductive pattern directly contacting the first conductive pattern thereunder; and
a first bonding enhancement layer between the first conductive pattern and the second dielectric layer,
wherein:
a bottom surface of the first bonding enhancement layer is at a lower level than an interface between the first dielectric layer and the second dielectric layer,
a top surface of the first bonding enhancement layer is at a higher level than the interface between the first dielectric layer and the second dielectric layer,
the first bonding enhancement layer includes the first bonding enhancement material or a material included in the second dielectric layer, and
the first bonding enhancement material includes a material having a higher bonding force to the material included in the second dielectric layer than a bonding force of the first conductive material to the material included in the second dielectric layer.

2. The semiconductor device as claimed in claim 1, wherein the first bonding enhancement material includes a material having a higher bonding force to oxygen than a bonding force of the first conductive material to oxygen.

3. The semiconductor device as claimed in claim 1, wherein a content, in wt %, of the first bonding enhancement material in the first conductive pattern is smaller than a content, in wt %, of the first conductive material in the first conductive pattern.

4. The semiconductor device as claimed in claim 1, wherein:
the first conductive material includes Cu, and
the first bonding enhancement material includes Mn.

5. The semiconductor device as claimed in claim 4, wherein a content of Mn in the first conductive pattern is more than 0 wt % to 5 wt %.

6. The semiconductor device as claimed in claim 1, wherein the first bonding enhancement layer includes an oxide of the first bonding enhancement material, a silicate of the first bonding enhancement material, or a combination thereof.

7. The semiconductor device as claimed in claim 1, wherein the first bonding enhancement layer includes MnSiO, MnO, CuMnO, CuMnSiO, or a combination thereof.

8. The semiconductor device as claimed in claim 1, wherein:
the first conductive pattern includes:
a barrier layer, and
a conductive layer on the barrier layer;
the conductive layer includes the first conductive material and the first bonding enhancement material; and
the first conductive material includes a material having a lower resistivity than the first bonding enhancement material.

9. The semiconductor device as claimed in claim 8, wherein:

the first bonding enhancement layer is between the second dielectric layer and the conductive layer; and the first bonding enhancement layer directly contacts the second dielectric layer and the conductive layer.

10. The semiconductor device as claimed in claim 8, further comprising a seed layer between the barrier layer and the conductive layer, wherein:

the seed layer includes the first conductive material and the first bonding enhancement material, and the first bonding enhancement layer is between the second dielectric layer and the conductive layer and between the second dielectric layer and the seed layer.

11. The semiconductor device as claimed in claim 1, wherein a thickness of the first bonding enhancement layer is greater than 0 nm to 1 nm.

12. The semiconductor device as claimed in claim 1, further comprising a second bonding enhancement layer between the second conductive pattern and the first dielectric layer, wherein:

the second conductive pattern includes a second conductive material and a second bonding enhancement material, and the second bonding enhancement material includes a material having a higher bonding force to a material included in the first dielectric layer than a bonding force of the second conductive material to the material included in the first dielectric layer.

13. The semiconductor device as claimed in claim 12, wherein the second bonding enhancement material includes a material having a higher bonding force to oxygen than a bonding force of the second conductive material to oxygen.

14. The semiconductor device as claimed in claim 12, wherein:

the second conductive material includes Cu, and the second bonding enhancement material includes Mn.

15. The semiconductor device as claimed in claim 12, wherein the second bonding enhancement layer includes an oxide of the second bonding enhancement material, a silicate of the second bonding enhancement material, or a combination thereof.

16. The semiconductor device as claimed in claim 12, wherein the second bonding enhancement layer includes MnSiO, MnO, CuMnO, CuMnSiO, or a combination thereof.

17. A semiconductor device, comprising:

a first substrate;

a first structure on the first substrate, the first structure including a first dielectric layer and a first conductive pattern in the first dielectric layer, the first conductive pattern including a first conductive material and a first bonding enhancement material;

a second substrate on the first structure;

a second structure between the first structure and the second substrate, the second structure including a second dielectric layer and a second conductive pattern in the second dielectric layer, the second dielectric layer directly contacting the first dielectric layer thereunder, the second conductive pattern directly contacting the first conductive pattern thereunder, and the second conductive pattern including a second conductive material and a second bonding enhancement material;

a first bonding enhancement layer between the first conductive pattern and the second dielectric layer; and a second bonding enhancement layer between the second conductive pattern and the first dielectric layer, wherein:

a bottom surface of at least one of the first bonding enhancement layer or the second bonding enhancement layer is at a lower level than an interface between the first dielectric layer and the second dielectric layer, a top surface of the at least one of the first bonding enhancement layer or the second bonding enhancement layer is at a higher level than the interface between the first dielectric layer and the second dielectric layer, the first bonding enhancement layer includes the first bonding enhancement material or a material included in the second dielectric layer, the second bonding enhancement layer includes the second bonding enhancement material or a material included in the first dielectric layer, the first bonding enhancement material includes a material having a higher bonding force to the material included in the second dielectric layer than a bonding force of the first conductive material to the material included in the second dielectric layer, and the second bonding enhancement material includes a material having a higher bonding force to the material included in the first dielectric layer than a bonding force of the second conductive material to the material included in the first dielectric layer.

18. A semiconductor device, comprising:

a first substrate;

a first structure on the first substrate, the first structure including a first dielectric layer and a first shielding pattern in the first dielectric layer, the first shielding pattern including a first conductive material and a first bonding enhancement material;

a second substrate on the first structure;

a plurality of photodiodes in the second substrate;

a second structure between the first structure and the second substrate, the second structure including a second dielectric layer and a second shielding pattern in the second dielectric layer, the second dielectric layer directly contacting the first dielectric layer thereunder, the second shielding pattern directly contacting the first shielding pattern thereunder, and the second shielding pattern including a second conductive material and a second bonding enhancement material;

a first bonding enhancement layer between the first shielding pattern and the second dielectric layer; and a second bonding enhancement layer between the second shielding pattern and the first dielectric layer, wherein:

a bottom surface of at least one of the first bonding enhancement layer or the second bonding enhancement layer is at a lower level than an interface between the first dielectric layer and the second dielectric layer, a top surface of the at least one of the first bonding enhancement layer or the second bonding enhancement layer is at a higher level than the interface between the first dielectric layer and the second dielectric layer, the first bonding enhancement layer includes the first bonding enhancement material or a material included in the second dielectric layer, the second bonding enhancement layer includes the second bonding enhancement material or a material included in the first dielectric layer, the first bonding enhancement material includes a material having a higher bonding force to the material included in the second dielectric layer than a bonding force of the first conductive material to the material included in the second dielectric layer, and the second bonding enhancement material includes a material having a higher bonding force to the material included in the first dielectric layer than a bonding force of the second conductive material to the material included in the first dielectric layer.

19. The semiconductor device as claimed in claim 18, further comprising:

a plurality of color filters on the plurality of photodiodes; and a plurality of microlenses on the plurality of color filters.

* * * * *